US012310024B2

United States Patent
Bicksler et al.

(10) Patent No.: US 12,310,024 B2
(45) Date of Patent: May 20, 2025

(54) MICROELECTRONIC DEVICES INCLUDING OXIDE MATERIAL BETWEEN DECKS THEREOF, AND RELATED MEMORY DEVICES

(71) Applicant: Lodestar Licensing Group LLC, Evanston, IL (US)

(72) Inventors: Andrew Bicksler, Nampa, ID (US); Wei Yeeng Ng, Boise, ID (US); James C. Brighten, Boise, ID (US)

(73) Assignee: Lodestar Licensing Group LLC, Evanston, IL (US)

( * ) Notice: Subject to any disclaimer, the term of this patent is extended or adjusted under 35 U.S.C. 154(b) by 0 days.

(21) Appl. No.: 18/437,609

(22) Filed: Feb. 9, 2024

(65) Prior Publication Data

US 2024/0188297 A1    Jun. 6, 2024

Related U.S. Application Data

(60) Continuation of application No. 17/661,713, filed on May 2, 2022, now Pat. No. 11,917,825, which is a
(Continued)

(51) Int. Cl.
*H10B 43/27* (2023.01)
*H01L 21/768* (2006.01)
(Continued)

(52) U.S. Cl.
CPC ....... *H10B 43/27* (2023.02); *H01L 21/76805* (2013.01); *H01L 21/76895* (2013.01);
(Continued)

(58) Field of Classification Search
CPC ......... H01L 27/11582; H01L 27/11556; H01L 21/76895; H01L 23/535; H01L 21/76805;
(Continued)

(56) References Cited

U.S. PATENT DOCUMENTS 8,278,170 B2    10/2012    Lee et al.
8,681,555 B2    3/2014    Liu
(Continued)

FOREIGN PATENT DOCUMENTS

CN    109390392 A    2/2019
CN    109427805 A    3/2019
(Continued)

OTHER PUBLICATIONS

Korean Notice of Reasons for Rejection for Korean Application No. 10-2022-7008378, dated Mar. 27, 2024, 15 pages with English translation.
(Continued)

*Primary Examiner* — Khaja Ahmad
*Assistant Examiner* — Khatib A Rahman
(74) *Attorney, Agent, or Firm* — TraskBritt

(57) ABSTRACT

A microelectronic device includes decks comprising alternating levels of a conductive material and an insulative material, the decks comprising pillars including a channel material extending through the alternating levels of the conductive material and the insulative material, a conductive contact between adjacent decks and in electrical communication with the channel material of the adjacent decks, and an oxide material between the adjacent decks, the oxide material extending between an uppermost level of a first deck and a lowermost level of a second deck adjacent to the first deck. Related electronic systems and methods of forming the microelectronic device and electronic systems are also disclosed.

15 Claims, 8 Drawing Sheets

Related U.S. Application Data division of application No. 16/541,944, filed on Aug. 15, 2019, now Pat. No. 11,355,514.

(51) Int. Cl.
*H01L 23/528* (2006.01)
*H01L 23/535* (2006.01)
*H10B 41/27* (2023.01)
*H10B 41/35* (2023.01)
*H10B 43/35* (2023.01)

(52) U.S. Cl.
CPC ........ *H01L 23/5283* (2013.01); *H01L 23/535* (2013.01); *H10B 41/27* (2023.02); *H10B 41/35* (2023.02); *H10B 43/35* (2023.02)

(58) Field of Classification Search
CPC ........... H01L 23/5283; H01L 27/11524; H01L 27/1157; H01L 27/11519; H01L 27/11568; H01L 27/11521; H01L 27/11565; H10B 43/27; H10B 43/30; H10B 41/27; H10B 41/35; H10B 43/35; H10B 41/10; H10B 41/30; H10B 43/10
See application file for complete search history.

(56) References Cited

U.S. PATENT DOCUMENTS

| | | | |
|---|---|---|---|
| 8,878,279 B2 | 11/2014 | Koval | |
| 9,905,575 B2 | 2/2018 | Lee | |
| 2003/0176031 A1 | 9/2003 | Onishi et al. | |
| 2012/0083077 A1 | 4/2012 | Yang et al. | |
| 2013/0059422 A1 | 3/2013 | Lee et al. | |
| 2013/0277731 A1 | 10/2013 | Goda et al. | |
| 2014/0264525 A1 | 9/2014 | Takahashi et al. | |
| 2014/0273373 A1 | 9/2014 | Makala et al. | |
| 2015/0170746 A1* | 6/2015 | Oowada | G11C 16/10 365/185.18 |
| 2015/0294980 A1 | 10/2015 | Lee et al. | |
| 2016/0104717 A1 | 4/2016 | Lu et al. | |
| 2017/0062330 A1 | 3/2017 | Kim et al. | |
| 2017/0194057 A1 | 7/2017 | Lee et al. | |
| 2017/0255742 A1* | 9/2017 | Lee | H10B 43/27 |
| 2017/0352677 A1 | 12/2017 | Zhu et al. | |
| 2017/0352681 A1 | 12/2017 | Lee | |
| 2018/0019255 A1 | 1/2018 | Hopkins et al. | |
| 2018/0119255 A1 | 5/2018 | Luo et al. | |
| 2018/0182771 A1 | 6/2018 | Costa et al. | |
| 2018/0308858 A1 | 10/2018 | Hopkins et al. | |
| 2018/0323055 A1 | 11/2018 | Woodruff et al. | |
| 2018/0366198 A1 | 12/2018 | Sakui | |
| 2019/0013329 A1 | 1/2019 | Lu et al. | |
| 2020/0135590 A1 | 4/2020 | Lai et al. | |
| 2020/0258898 A1 | 8/2020 | Hu et al. | |
| 2020/0303399 A1* | 9/2020 | Xiao | H01L 21/31111 |
| 2020/0328225 A1* | 10/2020 | Xiao | H10B 43/35 |

FOREIGN PATENT DOCUMENTS

| | | |
|---|---|---|
| CN | 110010609 A | 7/2019 |
| CN | 109314118 A | 11/2019 |
| CN | 109417072 B | 1/2020 |
| CN | 110088906 B | 11/2020 |
| CN | 109155316 B | 5/2021 |
| JP | 59-178752 A | 10/1984 |
| JP | 60-070743 A | 4/1985 |
| JP | 2017-530548 A | 10/2017 |
| WO | 2018/136730 A | 7/2018 |

OTHER PUBLICATIONS

International Search Report for Application No. PCT/US2020/070313, mailed Nov. 10, 2020, 3 pages.
Japanese Notice of Reasons for Refusal for Japanese Application No. 2022-508978, dated Jun. 6, 2023, 7 pages with English translation.
Written Opinion of the International Searching Authority for Application No. PCT/US2020/070313, mailed Nov. 10, 2020, 3 pages.
Chinese First Office Action and Search Report for Chinese Application No. 202080057034.8, dated Dec. 28, 2024, 9 pages with translation.

* cited by examiner

MICROELECTRONIC DEVICES INCLUDING OXIDE MATERIAL BETWEEN DECKS THEREOF, AND RELATED MEMORY DEVICES

CROSS-REFERENCE TO RELATED APPLICATIONS

This application is a continuation of U.S. patent application Ser. No. 17/661,713, filed May 2, 2022, now U.S. Pat. No. 11,917,825, issued Feb. 27, 2024, which is a divisional of U.S. patent application Ser. No. 16/541,944, filed Aug. 15, 2019, now U.S. Pat. No. 11,355,514, issued Jun. 7, 2022, the disclosure of each of which is hereby incorporated herein in its entirety by this reference.

TECHNICAL FIELD

Embodiments disclosed herein relate to microelectronic devices and electronic systems including an oxide material between decks of alternating levels of insulative material and conductive material, and to related methods. More particularly, embodiments of the disclosure relate to microelectronic devices and electronic systems comprising memory strings extending through decks of alternating levels of insulative material and conductive material and including an oxide material that does not exhibit charge trapping characteristics, and to related methods of forming the microelectronic devices and electronic systems.

BACKGROUND

A continuing goal of the semiconductor industry has been to increase the memory density (e.g., the number of memory cells per memory die) of memory devices, such as non-volatile memory devices (e.g., NAND Flash memory devices). To meet demands for higher capacity memories, designers continue to strive for increasing memory density, (i.e., the number of memory cells for a given area of an integrated circuit die). One way to increase memory density is to reduce the feature size of individual memory cells. However, as the feature size decreases, the thickness of different portions of the memory cell, such as a tunnel dielectric material, may also exhibit a similar decrease in size. A tunnel dielectric material having a low thickness may result in an increased risk of failure of the tunnel dielectric material and charge leakage from a storage node of the memory cell.

Another proposal for increasing memory density in non-volatile memory devices is to utilize vertical memory array (also referred to as a "three-dimensional (3D) memory array") architectures. A conventional vertical memory array includes semiconductor pillars extending through openings in tiers of conductive structures (e.g., word lines, control gates) and dielectric materials at each junction of the semiconductor pillars and the conductive structures. Such a configuration permits a greater number of transistors to be located in a unit of die area by building the array upwards (e.g., longitudinally, vertically) on a die, as compared to structures with conventional planar (e.g., two-dimensional) arrangements of transistors. As the demand for higher densities of memory cells increases, the semiconductor pillars are patterned to have a smaller pitch between adjacent pillars. In addition, multiple decks comprising the tiers of conductive structures and dielectric materials may be patterned one over the other to facilitate an increased number of memory cells in the device.

DETAILED DESCRIPTION

Figure 1A:
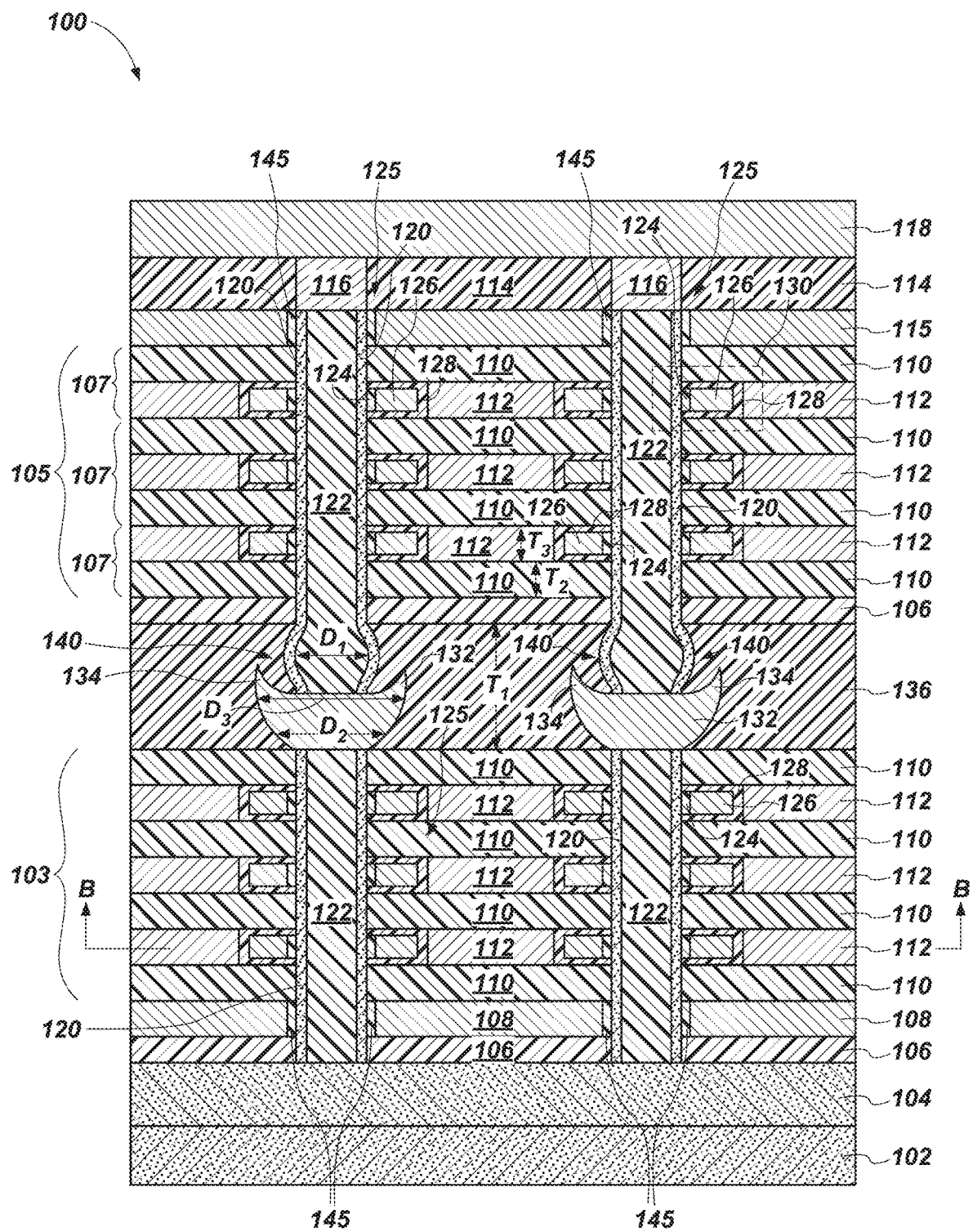
FIG. 1A is a simplified cross-sectional view of a microelectronic device, in accordance with embodiments of the disclosure.

The illustrations included herewith are not meant to be actual views of any particular systems, microelectronic devices, electronic systems, or memory cells, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a microelectronic device or an electronic system, or a complete description of a process flow for fabricating the microelectronic device or electronic system. The structures described below do not form complete microelectronic devices or electronic systems. Only those process acts and structures necessary to understand the embodiments described herein are described in detail below. Additional acts to form a complete microelectronic device or electronic system may be performed by conventional techniques.

The materials described herein may be formed by conventional techniques including, but not limited to, spin coating, blanket coating, chemical vapor deposition (CVD), atomic layer deposition (ALD), plasma-enhanced ALD, physical vapor deposition (PVD), plasma-enhanced chemical vapor deposition (PECVD), or low-pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, an "electrically conductive material" may refer to one or more of a metal, such as tungsten, titanium, nickel, platinum, palladium, ruthenium, aluminum, copper, molybdenum, gold, a metal alloy, a metal-containing material (e.g., metal nitrides, metal silicides (tantalum silicides, tungsten silicides, nickel silicides, titanium silicides), metal carbides, metal oxides), a conductively doped semiconductor material (e.g., conductively doped silicon, conductively doped germanium, conductively doped silicon germanium, etc.), polysilicon, other materials exhibiting electrical conductivity, or combinations thereof. Electrically conductive materials may include at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide ($IrO_x$), elemental ruthenium (Ru), ruthenium oxide ($RuO_x$), elemental tungsten (W), elemental aluminum (Al), elemental copper (Cu), elemental gold (Au), elemental silver (Ag), polysilicon, alloys thereof, or combinations thereof. The terms "electrically conductive material" and "conductive material" may be used interchangeably herein.

According to embodiments described herein, a microelectronic device includes decks comprising alternating levels of a conductive material (which may also be characterized as access lines (e.g., word lines) or gate electrodes) and an insulative material (e.g., a dielectric material). Pillars of a channel material may extend through the decks and may form strings of memory cells. For example, memory cells may be located at an intersection proximate the channel material and at least some of the levels of the conductive material. One or more of a dielectric material (e.g., one or more of a tunnel dielectric material, a charge trapping material, a charge blocking material, or another material) may be located between the channel material and at least some of the levels of the conductive material. Another conductive material (e.g., an electrode material) may be located proximate to some of the dielectric materials. In some embodiments, the electrode material is located between dielectric materials. Memory cells associated with different levels of the conductive material may be isolated from one another at least by the intervening level of the insulative material.

A conductive contact electrically couples the channel material of one deck to the channel material of an adjacent deck. In some embodiments, the volume between the adjacent decks is free of charge trapping materials, such as silicon nitride. For example, an insulative material, such as an oxide material (e.g., silicon dioxide), may be located between the adjacent decks. The oxide material may facilitate decoupling between the channel material between adjacent pillars. The oxide material may extend from one deck to an adjacent deck and may electrically isolate the conductive contacts electrically coupling the channel materials of the adjacent decks. In some embodiments, the oxide material substantially fills the volume between the adjacent decks and between conductive contacts of adjacent pillars. In other embodiments, the oxide material lines the conductive contacts and at least a portion of one of the decks (e.g., an insulative material of at least one of the decks). Another electrically conductive material is adjacent to the oxide material and fills the remaining volume between the adjacent decks and between the oxide material lining adjacent conductive contacts.

The oxide material may reduce or prevent electrical coupling between adjacent pillars proximate a location between the adjacent decks. The oxide material may comprise a material that is not prone to charge trapping (e.g., electron trapping) and associated de-trapping of charges. Due, at least in part, to the presence of the oxide material, the pillars including the strings of memory cells may exhibit improved device performance, such as reduced read write bias and an increased operating window compared to conventional memory cells. In some embodiments including the conductive material adjacent to the oxide material, the conductive material may reduce or prevent interactions between the channel materials of adjacent pillars. In some embodiments, the conductive material may improve string current of the string of memory cells and may also improve gate induced drain leakage (GIDL).

FIG. 1A is a simplified cross-sectional view of a microelectronic device 100, in accordance with embodiments of the disclosure. The microelectronic device 100 may include a first deck 103 adjacent to (e.g., over) a base material 102 and a second deck 105 adjacent to (e.g., over) the first deck 103. The base material 102 may comprise a substrate or a construction upon which additional materials are formed. The base material 102 may be a semiconductor substrate, a base semiconductor layer on a supporting structure, a metal electrode, or a metal electrode on a semiconductor substrate having one or more layers, structures or regions formed thereon. The base material 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The base material 102 may be doped or undoped.

The first deck 103 and the second deck 105 may each independently comprise alternating levels of an insulative material 110 and a conductive material 112. For example, the microelectronic device 100 may include tiers 107, each tier 107 comprising an insulative material 110 and a conductive material 112.

Although FIG. 1A illustrates that the microelectronic device 100 includes only two decks 103, 105, the disclosure is not so limited. In other embodiments, the microelectronic device 100 includes more than two decks 103, 105, such as three decks, four decks, six deck, eight decks, or another number of decks. In addition, although FIG. 1A illustrates that the first deck 103 and the second deck 105 include three tiers 107, the disclosure is not so limited. In other embodiments, the first deck 103 and the second deck 105 may each individually comprise more than at least about 32 tiers 107 or alternating levels of conductive material 112 and insulative material 110, such as at least about 64 tiers 107, at least about 128 tiers 107, or even at least about 256 tiers 107. In some embodiments, the first deck 103 and the second deck 105 comprise the same number of tiers 107. In other embodiments, the first deck 103 includes a different number of tiers 107 than the second deck 105.

A source 104, such as a source region, may be located between the base material 102 and the first deck 103. An etch stop material 106 may be adjacent to the source 104 and a conductive material 108 may be adjacent to the etch stop material 106.

The source 104 may include, for example, a semiconductor material doped with one of P-type conductivity materials or N-type conductivity materials. As used herein, an N-type conductivity material may include, for example, polysilicon doped with at least one N-type dopant (e.g., arsenic ions, phosphorous ions, antimony ions). As used herein, a P-type conductivity material may include, for example, polysilicon doped with at least one P-type dopant (e.g., boron ions). In some embodiments, the source 104 includes N-type conductivity materials. In other embodiments, the source 104 comprises tungsten, tungsten silicide, or another material.

The etch stop material 106 may comprise, for example, one or more of aluminum oxide ($Al_2O_3$), titanium dioxide ($TiO_2$), silicon carbide doped with nitrogen (SiCN), aluminum nitride, aluminum oxynitride, silicon carbide, or another material. In some embodiments, the etch stop material 106 comprises aluminum oxide. The etch stop material 106 may be formulated and configured to exhibit an etch selectivity with respect to the materials of the first deck 103 and the second deck 105 (e.g., with respect to the insulative materials 110 and the conductive materials 112). During formation of the first deck 103 and the second deck 105, portions of the insulative material 110 and the conductive material 112 of the respective first deck 103 and second deck 105 may be removed without substantially removing the etch stop material 106.

The conductive material 108 may comprise a so-called select gate source material. The conductive material 108 may include an electrically conductive material, such as one or more of a metal, such as tungsten, titanium, nickel, chromium, cobalt, platinum, palladium, ruthenium, rhodium, iridium, tantalum, aluminum, copper, molybdenum, gold, silver, a metal alloy, a conductive metal-containing material, (e.g., a conductive metal nitride (titanium nitride (TiN), tantalum nitride (TaN), tungsten nitride (WN), titanium aluminum nitride (TiAlN)), a conductive metal oxide (iridium oxide ($IrO_x$), ruthenium oxide ($RuO_x$), titanium dioxide), a conductive metal silicide (tantalum silicides, tungsten silicides, nickel silicides, titanium silicides)), a conductively doped semiconductor material (e.g., conductively doped silicon, conductively doped germanium, conductively doped silicon germanium, etc.), polysilicon, other materials exhibiting electrical conductivity, alloys thereof, or combinations thereof. In some embodiments, the conductive material 108 comprises polysilicon (e.g., P-type polysilicon), or another material.

The insulative material 110 may comprise a dielectric material, such as, for example, silicon dioxide, or other dielectric materials.

The conductive material 112 may comprise an electrically conductive material, such as one or more of the materials described above with reference to the conductive material 108. In some embodiments, the conductive material 112 comprises polysilicon. In some embodiments, the conductive material 112 has the same composition as the conductive material 108. The conductive material 112 may also be referred to herein as access lines (e.g., word lines) or gate electrodes.

With continued reference to FIG. 1A, pillars 125 comprising a channel material 120 may extend through the first deck 103 and the second deck 105. The channel material 120 may be in electrical communication with the source 104. The channel material 120 may include a semiconductor material, such as, for example, polysilicon. In some embodiments, the channel material 120 comprises P-type polysilicon. In other embodiments, the channel material 120 comprises a metal oxide semiconductor material. In some embodiments, the channel material 120 comprises polysilicon. The channel material 120 may be electrically isolated from the conductive material 108 and the conductive material 115 by an insulative material 145. The insulative material 145 may comprise a dielectric material. For example, the insulative material 145 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), or a dielectric carboxynitride material (e.g., silicon carboxynitride (SiOCN)).

In some embodiments, the pillars 125 further include an electrically insulative material 122 between portions of the channel material 120. The electrically insulative material 122 may include, for example, phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), or combinations thereof. In some embodiments, the electrically insulative material 122 comprises silicon dioxide.

Memory cells 130 may be located at intersections between the channel material 120 and the conductive materials 112. The memory cells 130 may comprise, for example, a dielectric material 124 (which may also be referred to as a tunnel dielectric material) between the channel material 120 and an electrode material 126 (which may also be referred to as a gate electrode, a floating gate, or a gate), and an other dielectric material 128 (which may also be referred to as a charge storage material) around at least a portion of the electrode material 126. In some embodiments, the memory cell 130 may be referred to herein as a "floating gate" memory cell. As will be described with reference to FIG. 1C, the memory cells 130 may include other materials and may be referred to herein as "charge trapping" memory cells.

The electrode material 126 may include an electrically conductive material. By way of nonlimiting example, the electrode material 126 may include a conductively doped semiconductor material (e.g., conductively doped silicon, conductively doped germanium, conductively doped silicon germanium, etc.), polysilicon, one or more of a metal such as tungsten, titanium, nickel, chromium, cobalt, platinum, palladium, ruthenium, rhodium, iridium, tantalum, aluminum, copper, molybdenum, gold, silver, or combinations thereof, a metal alloy a conductive metal-containing material, (e.g., a conductive metal nitride (titanium nitride (TiN), tantalum nitride (TaN), tungsten nitride (WN), titanium aluminum nitride (TiAlN)), a conductive metal oxide (iridium oxide ($IrO_x$), ruthenium oxide ($RuO_x$), titanium dioxide), a conductive metal silicide (tantalum silicides, tungsten silicides, nickel silicides, titanium silicides)), alloys thereof, or combinations thereof. In some embodiments, the electrode material 126 comprises tungsten. In other embodiments, the electrode material 126 comprises polysilicon. In some such embodiments, the polysilicon may be doped and may comprise, for example, n-doped polysilicon or p-doped polysilicon.

The dielectric material 124 may include, for example, a tunnel oxide material. In some embodiments, the dielectric material 124 comprises silicon dioxide. However, the disclosure is not so limited and the dielectric material 124 may comprise another material, such as one or more of the materials described above with reference to the insulative material 145. In some embodiments, the dielectric material 124 comprises the same material composition as the insulative material 145. Although FIG. 1A illustrates the dielectric material 124 only on sides proximate the conductive materials 112 and not in contact with or located on sides of the insulative materials 110, the disclosure is not so limited. In other embodiments, the dielectric material 124 extends continuously through the entire first deck 103 and the entire second deck 105 to the conductive contact 132. In some embodiments, the dielectric material 124 may be grown on the electrode material 126, such as by an in-situ steam generation (ISSG) process to selectively oxidize exposed portions of the electrode material 126.

The other dielectric material 128 may include a charge trapping material, such as an oxide-nitride-oxide (ONO) structure. For example, the other dielectric material 128 may comprise a first oxide material, a silicon nitride material adjacent to the first oxide material, and a second oxide material adjacent to the silicon nitride material. The first oxide material and the second oxide material may include silicon dioxide, hafnium oxide, zirconium oxide, or another material. In some embodiments, the first oxide material and the second oxide material have the same material composition. In some embodiments, the first oxide material and the second oxide material comprise silicon dioxide. In some embodiments, the other dielectric material 128 may also be referred to as an interpoly dielectric (IPD) material.

Figure 1B:
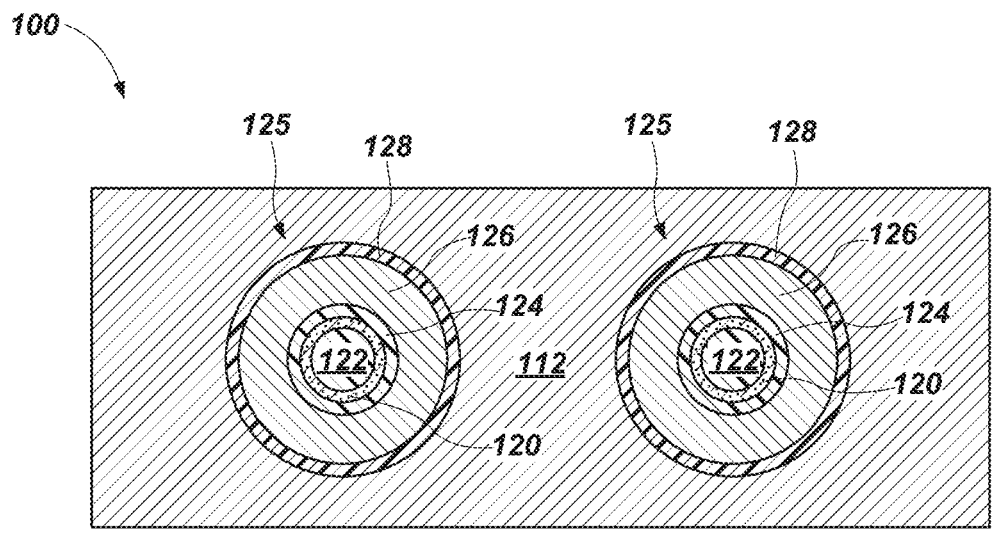
FIG. 1B is a simplified cross-sectional view of the microelectronic device taken along section line B-B of FIG. 1A.

FIG. 1B is a simplified cross-sectional view of the microelectronic device 100 taken along section line B-B of FIG. 1A. The pillars 125 may include a circular cross-sectional shape. In some embodiments, the channel material 120 may surround the electrically insulative material 122 and may exhibit a circular cross-sectional shape. The dielectric material 124 may surround the channel material 120 and may be located between the channel material 120 and the electrode material 126. The other dielectric material 128 may be located between the electrode material 126 and the conductive material 112.

Referring back to FIG. 1A, another conductive material 115 may be formed adjacent to the insulative material 110 of the uppermost tier 107. The conductive material 115 may comprise a so-called select gate drain (SGD) material. The conductive material 115 may comprise one or more of the materials described above with reference to the conductive material 108. In some embodiments, the conductive material 115 has the same material composition as the conductive material 108. An insulative material 114 may be formed adjacent to the conductive material 115. The insulative material 114 may be patterned and conductive contacts 116 (which may also be referred to herein as conductive plugs) may be adjacent to and in electrical communication with the channel material 120. A conductive line 118 (e.g., data line, bit line) may be adjacent to and in electrical communication with the conductive contacts 116.

In some embodiments, the channel material 120 may exhibit a bulge 140 at a location between the first deck 103 and the second deck 105. A distance $D_1$ between opposing portions of the bulge 140 (e.g., the diameter of the channel material 120 at the bulge 140) may be greater than a distance between opposing portions of the channel material 120 at other portions of the channel material 120. In other words, the channel material 120 may have a larger diameter proximate the bulge 140 relative to other locations of the channel material 120.

The bulge 140 may be a result of the method of forming the microelectronic device 100, such as the method of forming the channel materials 120 to extend through the first deck 103 and the second deck 105 and forming the conductive contacts 132 between the first deck 103 and the second deck 105.

The conductive contacts 132 may electrically couple the channel material 120 of a pillar 125 of the first deck 103 to the channel material 120 of a corresponding pillar 125 of the second deck 105. In other words, the channel material 120 of the first deck 103 may be in electrical communication with the channel material 120 of the second deck 105 through the conductive contact 132. The conductive contacts 132 may comprise an electrically conductive material. In some embodiments, the conductive contacts 132 comprise polysilicon. In some embodiments, the conductive contacts 132 comprise the same material composition as the conductive materials 112.

The conductive contacts 132 may include protruding portions 134 which extend farther (up and down in the view shown in FIG. 1A) from an underlying insulative material 110 than other portions (e.g., central portions) of the respective conductive contact 132. In some embodiments, a distance $D_2$ between opposite sides of the conductive contacts 132 at a location proximate the underlying insulative material is less than a distance $D_3$ between opposing protruding portions 134 of the respective conductive contact 132.

An oxide material 136 may be located between the first deck 103 and the second deck 105. The oxide material 136 may comprise an electrically insulative material. In some embodiments, the oxide material 136 comprises a material that does not exhibit charge trapping (e.g., electron trapping) and de-trapping properties. For example, the oxide material 136 is free of (e.g., substantially free of) silicon nitride. In other words, the microelectronic device 100 may not include silicon nitride at locations between the first deck 103 and the second deck 105.

The oxide material 136 may comprise one or more of silicon dioxide, phosphosilicate glass, borosilicate glass, borophosphosilicate glass (BPSG), fluorosilicate glass, an oxynitride (e.g., silicon oxynitride), aluminum oxide, hafnium oxide, zirconium oxide, titanium oxide, tantalum oxide, molybdenum oxide, or a spin-on dielectric (SOD) (e.g., hydrogen silsesquioxane (HSQ), methylsilsesquioxane (MSQ), a polyimide, polytetrafluoroethylene (PTFE), a spin-on polymer). The oxide material 136 may exclude silicon nitride. In some embodiments, the oxide material 136 comprises silicon dioxide. In some embodiments, at least a portion of the volume between the first deck 103 and the second deck 105 may include one or more voids. The one or more voids may be filled with one or more of oxygen, nitrogen, air, helium, or another gas. In some embodiments, the one or more voids is filled with oxygen and nitrogen.

The oxide material 136 may directly contact the first deck 103 and the second deck 105. In some embodiments, the oxide material 136 directly contacts an insulative material 110 of the first deck 103 and an insulative material 110 of the second deck 105 (such as where the second deck 105 does not include the etch stop material 106). For example, the oxide material 136 may be located directly between an uppermost insulative material 110 of the first deck 103 and a lowermost insulative material 110 of the second deck 105. In some embodiments, the oxide material 136 may directly contact the uppermost insulative material 110 of the first deck 103 and the lowermost insulative material 110 of the second deck 105. In other embodiments, the oxide material 136 directly contacts an insulative material 110 of the first deck 103 and directly contacts the etch stop material 106 in contact with an insulative material 110 of the second deck 105. In some embodiments, at least a portion of the oxide material 136 is located laterally directly between the conductive contacts 132 of adjacent pillars 125. Although FIG. 1A has been described and illustrated as including the oxide material 136 directly contacting the uppermost insulative material 110 of the first deck 103 and the etch stop material 106 of the second deck 105, the disclosure is not so limited. In other embodiments, the oxide material 136 may directly contact an uppermost conductive material of the first deck 103 and a lowermost conductive material 112 of the second deck 105 (or the etch stop material 106 of the second deck 105). In some such embodiments, the oxide material 136 is the only material intervening between portions of the uppermost conductive material 112 of the first deck 103 and the lowermost conductive material 112 of the second deck 105. In some embodiments, the oxide material 136 directly contacts the channel material proximate the bulge 140.

The oxide material 136 may have a thickness $T_1$ within a range from about 50 nm to about 200 nm, such as from about 50 nm to about 75 nm, from about 75 nm to about 100 nm, from about 100 nm to about 150 nm, or from about 150 nm to about 200 nm. In some embodiments, the thickness T is about 100 nm.

In some embodiments, the thickness $T_1$ of the oxide material 136 may be greater than a thickness of the levels of the insulative material 110. In some embodiments, the thickness $T_1$ of the oxide material 136 is greater than the thickness of the levels of the conductive material 112. For example, each level of insulative material 110 may have a thickness $T_2$ within a range from about 20 nm to about 10 nm to about 50 nm, such as from about 10 nm to about 20 nm, from about 20 nm to about 30 nm, from about 30 nm to about 40 nm, or from about 40 nm to about 50 nm. Each level of conductive material 112 may have a thickness $T_3$ within a range from about 10 nm to about 50 nm, such as from about 10 nm to about 20 nm, from about 20 nm to about 30 nm, from about 30 nm to about 40 nm, or from about 40 nm to about 50 nm. In some embodiments, the thickness $T_1$ of the oxide material 136 may be greater than a thickness of each of the tiers 107 (i.e., the sum of the thickness $T_2$ and the thickness $T_3$).

In some embodiments, the oxide material 136 may reduce or prevent (e.g., substantially prevent) coupling of the channel materials 120 of adjacent pillars 125 at locations between the first deck 103 and the second deck 105 or at locations proximate the oxide material 136. In addition, the oxide material 136 may comprise a material composition formulated and configured to exhibit a reduced degree of charge trapping than conventional materials that are used between adjacent deck structures. For example, conventional microelectronic devices may include a silicon nitride material between adjacent decks. Due to the large space between the adjacent decks and, in particular, the large space between conductive materials 112 of the adjacent decks (e.g., an uppermost conductive material 112 of the first deck 103 and a lowermost conductive material 112 of the second deck 105, which may be spaced from each other at least by an uppermost insulative material 110 of the first deck 103, a lowermost insulative material 110 of the second deck 105, and the oxide material 136 between the first deck 103 and the second deck 105), the silicon nitride material may trap charges (e.g., electrons) that may cause one pillar 125 including the channel material 120 to couple to adjacent pillars 125. In some instances, when a first pillar 125 is selected for programming (writing) and a second pillar 125 is inhibited, such as by applying a potential of about 0 V to the channel material 120 of the first pillar 125 and applying a potential (e.g., about 10 V) to the channel material 120 of the second pillar 125, electrons may become trapped in such a silicon nitride material located between adjacent decks between the first pillar 125 and the second pillar 125. The trapped charges (e.g., electrons) in the silicon nitride material may affect a threshold voltage of the memory cells 130 and may reduce the operating (e.g., read) window of the memory cells 130.

In addition, charges may not become trapped in the oxide material 136. By way of comparison, conventional microelectronic devices may include silicon nitride or other materials between the first deck 103 and the second deck 105, which materials may trap charges and couple to the bulges 140, which may be present in the channel material 120 due to various processing conditions (e.g., deposition of various materials, etching acts, cleaning acts) used to form the pillars 125. In other words, the bulges 140 may couple to a charge trapping material between the adjacent decks in conventions devices. Further, the protruding portions 134 of the conductive contact 132 may exhibit a relatively higher electric field (such as by an increase in current density) than other portions of the conductive contact 132. In conventional microelectronic devices, the high field at the protruding portions 134 may facilitate injection of electrons or other charges into a silicon nitride material proximate the conductive contact 132 during use and operation of the microelectronic device 100. Injection of electrons or other charges may result in a reduced operating window for the memory cells 130.

Forming the oxide material 136 to include a material composition that does not trap charges (e.g., electrons) may reduce or prevent charge trapping within the channel material 120, such as proximate the bulges 140 and at locations proximate the protruding portions 134. Accordingly, the microelectronic device 100 may include pillars 125 including strings of memory cells 130 exhibiting a larger operating window than in conventional microelectronic devices because the adjacent pillars 125 do not couple to one another.

Figure 1C:
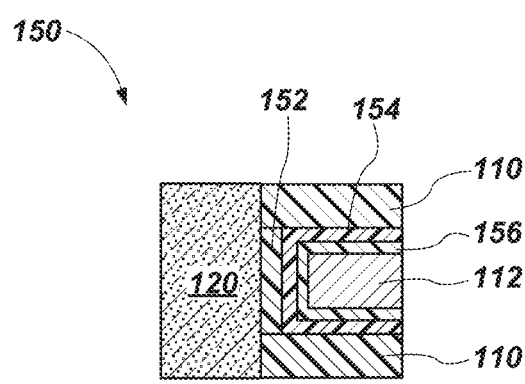
FIG. 1C is a simplified cross-sectional view of a memory cell, in accordance with embodiments of the disclosure.

Although FIG. 1A has been described and illustrated as including a particular type of memory cell 130 (e.g., floating gate memory cells), the disclosure is not so limited. FIG. 1C is a simplified cross-sectional view of a memory cell 150 that may be present in the microelectronic device 100 of FIG. 1A in place of the memory cells 130 (FIG. 1A). The memory cells 150 may comprise a so-called charge trapping material. In some such embodiments, the associated microelectronic device 100 may comprise a charge trapping NAND. The memory cells 150 may be referred to herein as a "charge trapping" memory cell.

FIG. 1C is a simplified cross-sectional view of a memory cell 150 that may be used interchangeably with the memory cells 130 of FIG. 1A, in accordance with embodiments of the disclosure. The memory cell 150 may include a dielectric material 152 (e.g., a tunnel dielectric material), a charge trapping material 154, and a charge blocking material 156 between the channel material 120 and the conductive material 112. The charge trapping material 154 may be located directly between the dielectric material 152 and the charge blocking material 156. In some embodiments, the dielectric material 152 directly contacts the channel material 120 and the charge trapping material 154. The charge blocking material 156 may directly contact and may be located directly adjacent to the charge trapping material 154 and the conductive material 112.

Although FIG. 1A has been described and illustrated as including the oxide material 136 between the first deck 103 and the second deck 105, the disclosure is not so limited. In other embodiments, one or more other materials may be located between the first deck 103 and the second deck 105.

Figure 2:
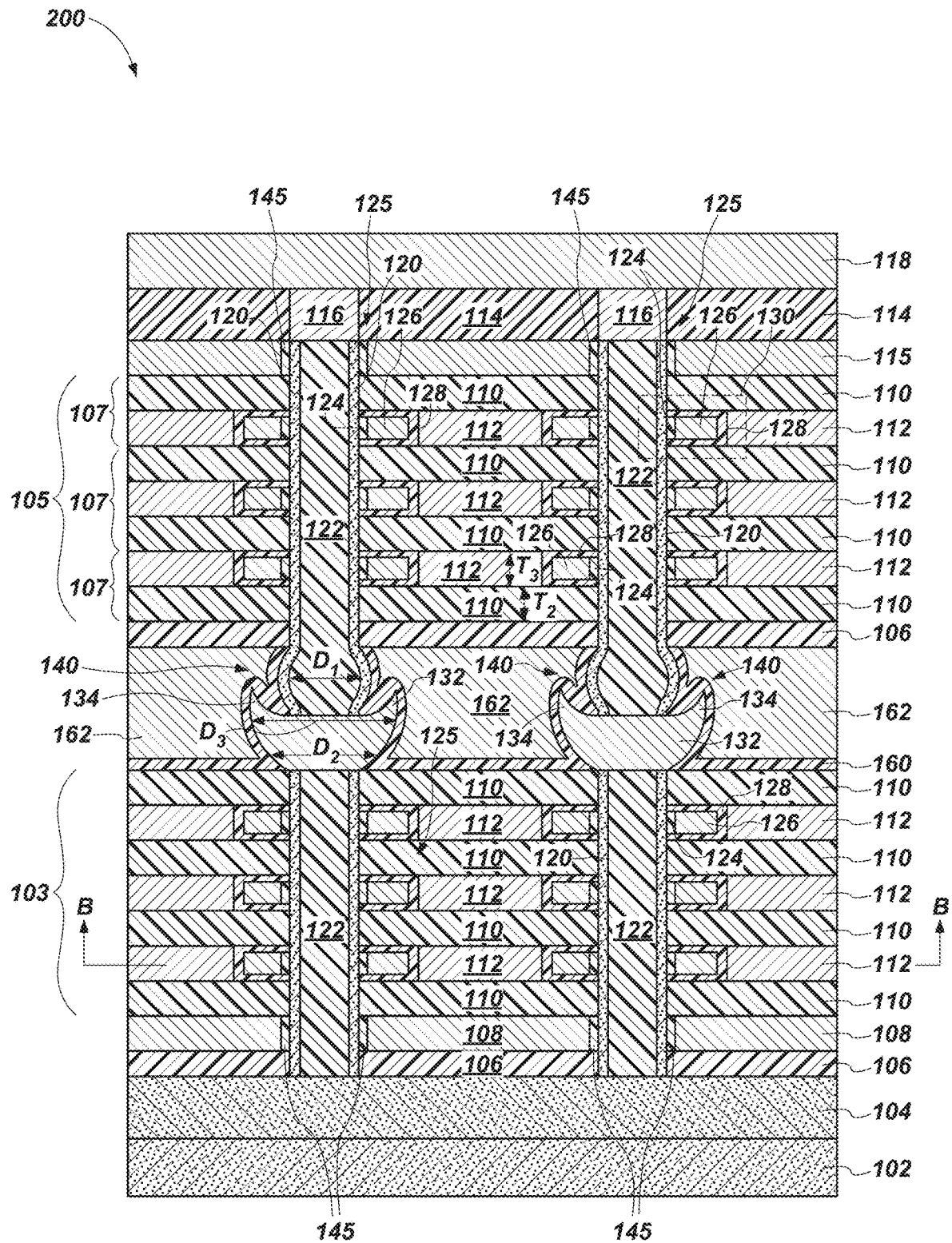
FIG. 2 is a simplified cross-sectional view of a microelectronic device, in accordance with embodiments of the disclosure.

FIG. 2 is a simplified cross-sectional view of a microelectronic device 200 in accordance with embodiments of the disclosure. The microelectronic device 200 may be substantially the same as the microelectronic device 100 of FIG. 1A, except that the microelectronic device 200 may include one or more additional materials between the first deck 103 and the second deck 105.

The microelectronic device 200 includes an oxide material 160 between the first deck 103 and the second deck 105 to electrically isolate adjacent conductive contacts 132 from each other. In some embodiments, the oxide material 160 may not substantially fill an entire volume between the first deck 103 and the second deck 105, such as a volume between the etch stop material 106 proximate the second deck 105 and an upper insulative material 110 of the first deck 103. In some embodiments, a remaining portion of the volume between the first deck 103 and the second deck 105 may be filled with one or more gases, such as one or more of oxygen, nitrogen, air, helium, or another gas. In some embodiments, the one or more voids is filled with oxygen and nitrogen. In other embodiments, a conductive material 162 may also be located between adjacent pillars 125 and electrically isolated from the adjacent pillars 125 and the associated conductive contact 132 at least by the oxide material 160.

In some embodiments, the oxide material 160 may comprise an oxide liner around sidewalls of the conductive contacts 132 and sidewalls of the channel material 120 located between the first deck 103 and the second deck 105. In some embodiments, the oxide material 160 may be adjacent to (e.g., conformally overlie) the conductive contact 132, the sidewalls of the channel material 120 located between the first deck 103 and the second deck 105, and an uppermost insulative material 110 of the first deck 103. The oxide material 160 may be adjacent to the bulge 140 of the channel material 120 and the protruding portions 134 of the conductive contacts 132.

The oxide material 160 may be adjacent to surfaces of an insulative material 110 of the first deck 103 and may be adjacent to surfaces of the conductive contacts 132 and the channel material 120 to a surface of the etch stop material 106. In other embodiments, the oxide material 160 extends adjacent to the surfaces of the conductive contacts 132 and the channel material 120 to a surface of an insulative material 110 of the second deck 105. As discussed above with reference to FIG. 1A and the oxide material 136, the oxide material 160 may be located directly between an uppermost insulative material 110 of the first deck 103 and a lowermost insulative material 110 of the second deck 105. In some embodiments, the oxide material 136 may directly contact the uppermost insulative material 110 of the first deck 103 and the lowermost insulative material 110 of the second deck 105. In other embodiments, the oxide material 160 directly contacts an insulative material 110 of the first deck 103 and directly contacts the etch stop material 106 in contact with an insulative material 110 of the second deck 105. In some embodiments, at least a portion of the oxide material 160 is located laterally directly between the conductive contacts 132 of adjacent pillars 125. In some such embodiments, spaces between the oxide material 160 on the conductive contacts 132 of adjacent pillars 125 may be separated by a void. The void may be filled with one or more gases or may be filled with the conductive material 162. Although FIG. 1A has been described and illustrated as including the oxide material 160 directly contacting the uppermost insulative material 110 of the first deck 103 and the etch stop material 106 of the second deck 105, the disclosure is not so limited. In other embodiments, the oxide material 160 may directly contact an uppermost conductive material of the first deck 103 and a lowermost conductive material 112 of the second deck 105 (or the etch stop material 106 of the second deck 105).

The oxide material 160 may comprise the same materials described above with reference to the oxide material 136 (FIG. 1A). In some embodiments, the oxide material 160 comprises silicon dioxide.

The conductive material 162 may be adjacent to the oxide material 160 and may fill a remaining volume between the first deck 103 and the second deck 105. The conductive material 162 may be adjacent to surfaces of the oxide material 160 adjacent to the first deck 103 and be adjacent to the oxide material 160 extending adjacent to the conductive contacts 132 and the channel material 120. The conductive material 162 may extend from the oxide material 160 adjacent to the first deck 103 to the etch stop material 106 adjacent to the second deck 105. In other embodiments, the conductive material 162 extends from the oxide material 160 to an insulative material 110 of the second deck 105.

The conductive material 162 may include an electrically conductive material. In some embodiments, the conductive material 162 comprises polysilicon. The conductive material 162 may be doped with one or more of boron, phosphorus, arsenic, antimony, or another material. In other embodiments, the conductive material 162 comprises tungsten. The conductive material 162 may, in some embodiments, comprise the same material composition as the conductive contacts 132.

The microelectronic device 200 may exhibit reduced charge trapping within the channel material 120 such as proximate the bulges 140 and at locations proximate the protruding portions 134. In addition, the conductive material 162 may facilitate shielding between adjacent pillars 125 and the channel materials 120 of adjacent pillars 125. In other words, the conductive material 162 between adjacent pillars 125 may reduce or prevent interactions between the channel material 120 of adjacent pillars 125.

In some embodiments, the conductive material 162 may improve string current of the string of memory cells 130 and may also improve gate induced drain leakage (GIDL). The conductive material 162 may be in electrical communication with a conductive contact located in a so-called stair-step structure of the microelectronic device. In use and operation, a voltage may be applied to the conductive material 162 proximate, for example, the channel material 120 of a selected memory string or an unselected memory string.

Accordingly, in at least some embodiments, a microelectronic device comprises decks comprising alternating levels of a conductive material and an insulative material, the decks comprising pillars including a channel material extending through the alternating levels of the conductive material and the insulative material, a conductive contact between adjacent decks and in electrical communication with the channel material of the adjacent decks, and an oxide material between the adjacent decks, the oxide material extending between an uppermost level of a first deck and a lowermost level of a second deck adjacent to the first deck.

Figure 3A:
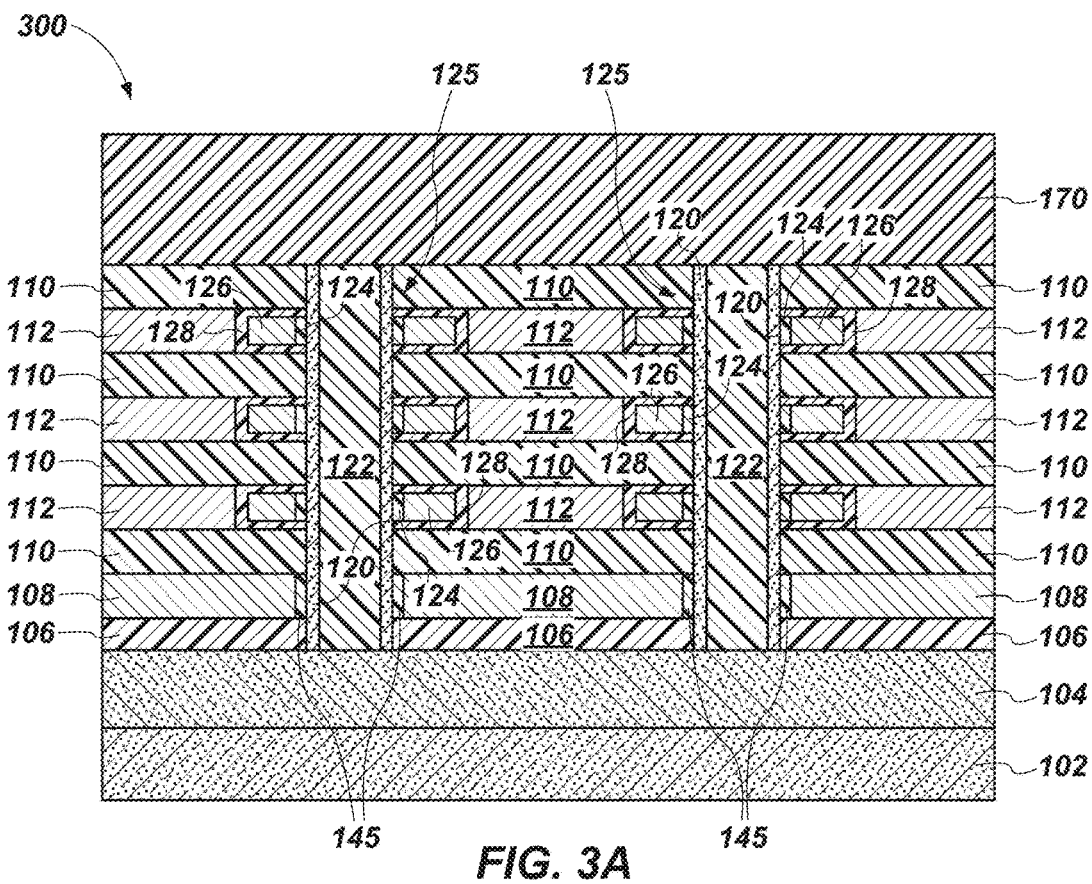
FIG. 3A through FIG. 3D are simplified cross-sectional views illustrating a method of forming a microelectronic device, in accordance with embodiments of the disclosure.

FIG. 3A through FIG. 3D are simplified cross-sectional views illustrating a method of forming the microelectronic device 100 of FIG. 1A, in accordance with embodiments of the disclosure. Referring to FIG. 3A, the first deck 103 (FIG. 1A) may be formed adjacent to the base material 102, the source 104, the etch stop material 106, and the conductive material 108 to form a semiconductor structure 300. The alternating levels of the insulative material 110 and the conductive material 112 of the first deck 103 may be formed adjacent to the conductive material 108.

After forming the levels of the insulative material 110 and the conductive material 112, openings may be formed through the levels of the insulative material 110 and the conductive material 112 and the conductive material 108 to expose portions of the etch stop material 106. The exposed portions of the etch stop material 106 may be removed through the openings to expose portions of the source 104. For example, in some embodiments, portions of the insulative material 110, the conductive material 112, and the conductive material 108 may be removed to form the openings by one removal act while a second removal act may be used to remove the portions of the etch stop material 106.

In some embodiments, such as in so-called "gate first" processes, the memory cells 130 may be formed by removing portions of the conductive material 112 to form recesses. The other dielectric material 128 may be formed in the recesses and adjacent to the remaining portions of the conductive material 112. The electrode material 126 may be formed adjacent to the other dielectric material 128 and the dielectric material 124 may be formed adjacent to the electrode material 126. After forming the dielectric material 124, the channel material 120 may be formed adjacent sides of the openings to form the memory cells 130. In some embodiments, after forming the channel material 120, the electrically insulative material 122 may be formed adjacent the channel material 120.

After forming the channel material 120 and the electrically insulative material 122, portions of the channel material 120 and the electrically insulative material 122 may be removed from surfaces of the uppermost insulative material 110.

Figure 3B:
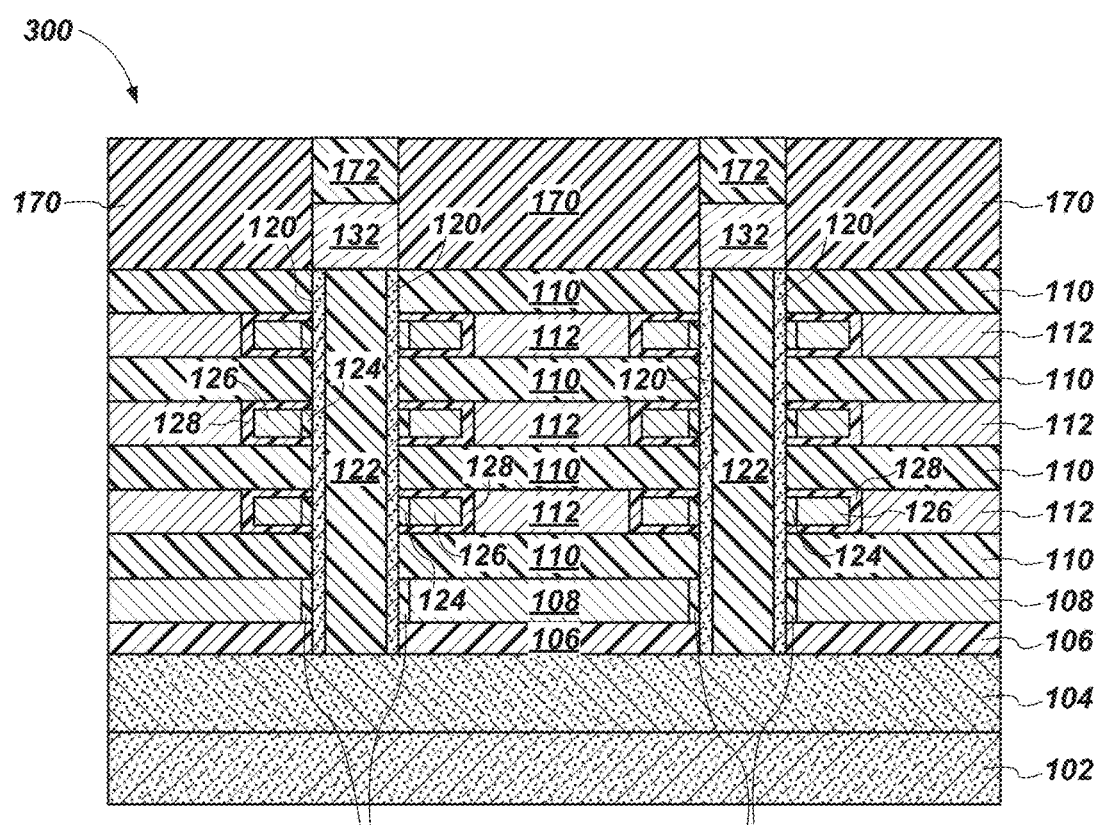

A silicon nitride material 170 may be formed adjacent to the exposed (e.g., the uppermost) insulative material 110. Referring to FIG. 3B, openings may be formed through the silicon nitride material 170 to expose the channel material 120. A conductive material may be formed in the openings and in electrical communication with the channel material 120 to form the conductive contacts 132. The conductive contacts 132 are illustrated in FIG. 3A through FIG. 3D without the protruding portions 134 (FIG. 1A). However, the conductive contacts 132 may include the protruding portions 134. An etch stop material 172 having an etch selectivity relative to the silicon nitride material 170 may be formed adjacent to the conductive contacts 132.

Figure 3C:
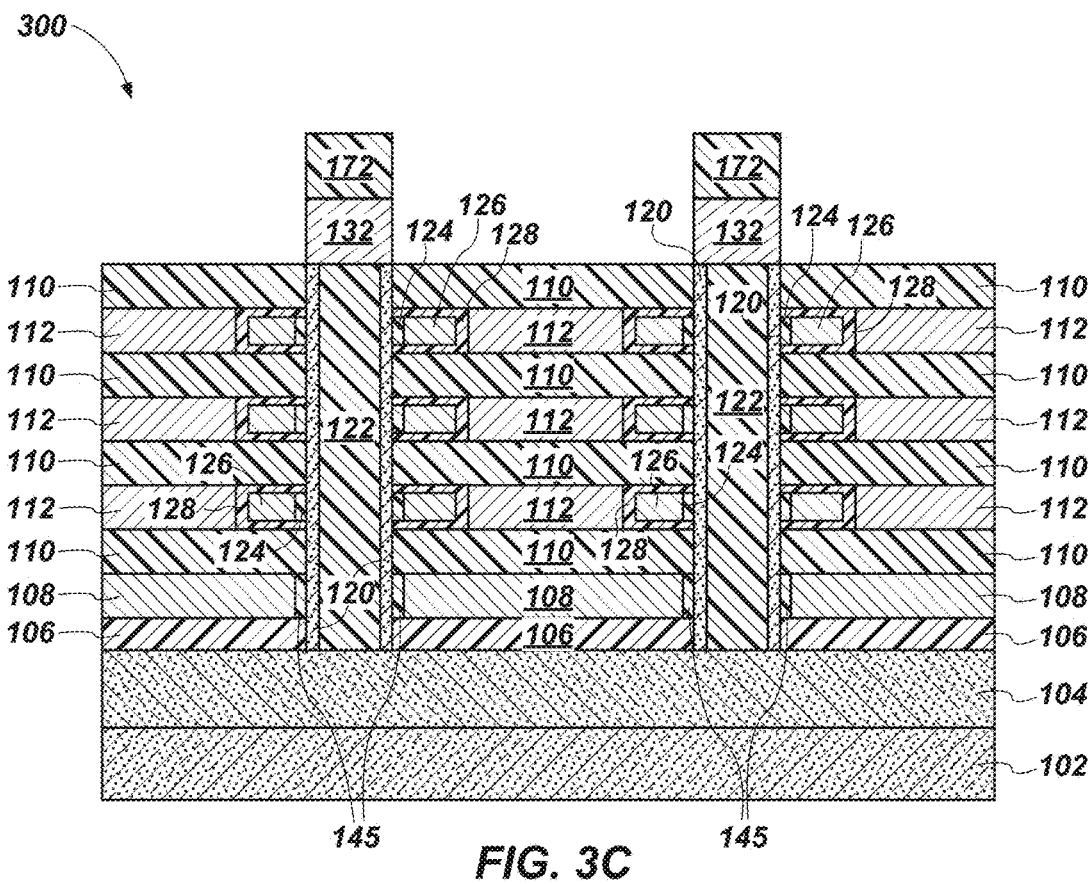

Referring to FIG. 3C, substantially all of the silicon nitride material 170 may be removed to expose portions of the insulative material 110. The insulative material 110 may exhibit an etch selectivity relative to the silicon nitride material 170. After removing the silicon nitride material 170, the conductive contacts 132 and the etch stop material 172 may remain adjacent to (e.g., over) the channel material 120.

Figure 3D:
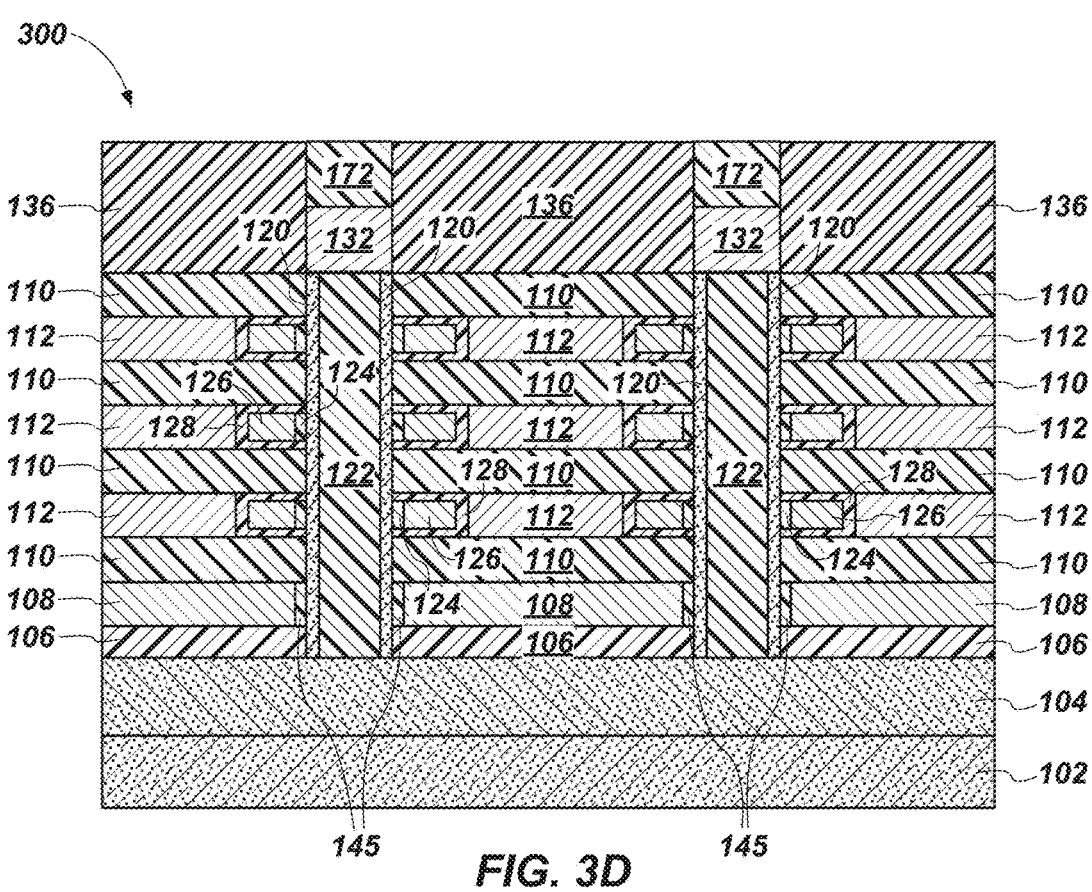

With reference to FIG. 3D, the oxide material 136 may be formed adjacent to the semiconductor structure 300, such as adjacent to (e.g., over) the insulative material 110 and adjacent to (e.g., on sides of) the conductive contacts 132 and the etch stop material 172. In some embodiments, after forming the oxide material 136, the semiconductor structure 300 may be exposed to a chemical mechanical planarization (CMP) process to expose portions of the etch stop material 172 through the oxide material 136. Although FIG. 3D illustrates that the oxide material 136 is formed directly on the uppermost insulative material 110, the disclosure is not so limited. In other embodiments, the oxide material 136 is formed directly on the uppermost conductive material 112.

After forming and planarizing the oxide material 136, the second deck 105 (FIG. 1A) may be formed adjacent to the semiconductor structure 300. For example, the etch stop material 106 (FIG. 1A) may be formed adjacent to the oxide material 136, and a stack of alternating levels of the insulative material 110 and conductive material 112 may be formed adjacent to the semiconductor structure 300. The second deck 105 may be formed in the same manner as formation of the first deck 103 (FIG. 1A). For example, openings may be formed in the stack of alternating levels of insulative material 110 and conductive material 112, portions of the conductive material 112 may be removed to form recesses, the other dielectric material 128 may be formed in the recesses, the electrode material 126 may be formed adjacent to the other dielectric material 128, the dielectric material 124 may be formed adjacent to the electrode material 126, and the channel material 120 may be formed adjacent to the dielectric material 124.

After forming the pillars 125 (FIG. 1A), the conductive contacts 116 may be formed through the insulative material 114 and adjacent to (e.g., over) the pillars 125 and in electrical communication with the channel material 120 of the second deck 105 (FIG. 1A). The conductive line 118 may be formed in electrical communication with the conductive contacts 116.

Figure 4:
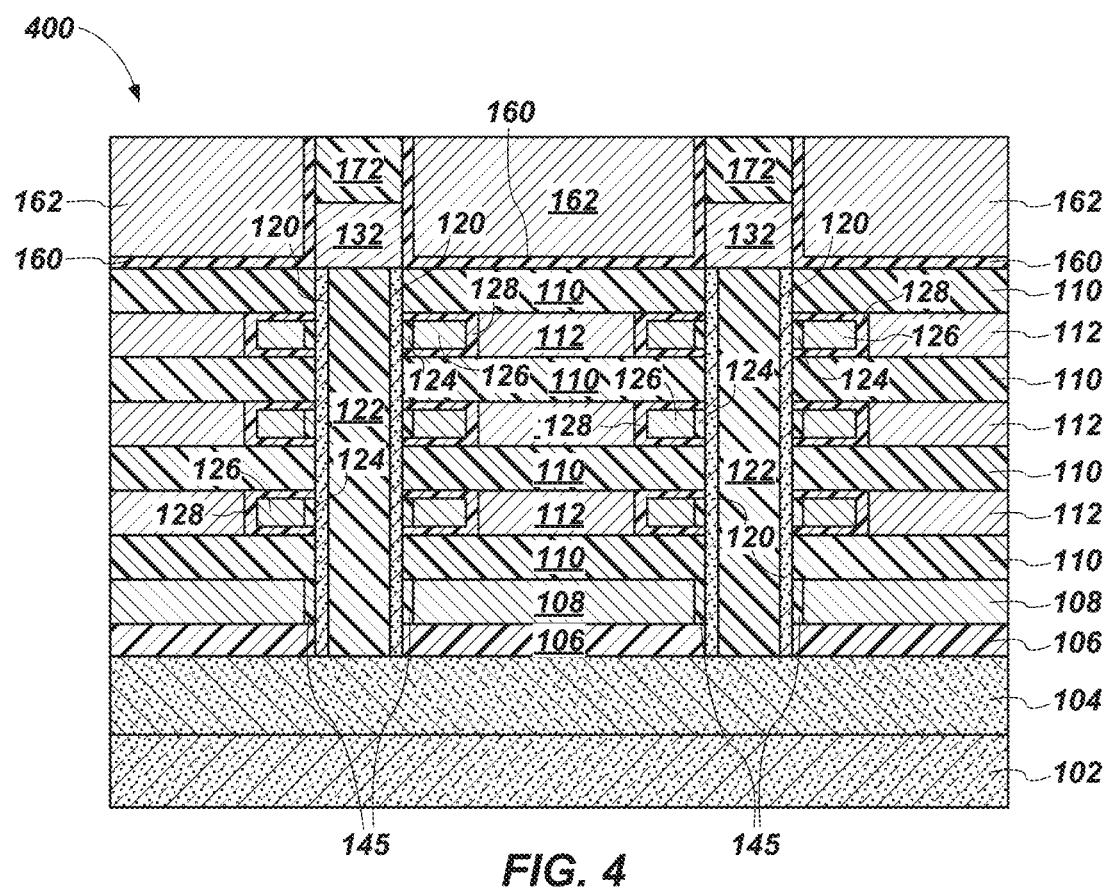
FIG. 4 is a simplified cross-sectional view illustrating a method of forming a microelectronic device, in accordance with other embodiments of the disclosure.

Although FIG. 3A through FIG. 3D illustrates forming the semiconductor structure 300 to include the oxide material 136 to fill the volume between the first deck 103 (FIG. 1A) and the second deck 105 (FIG. 1A), the disclosure is not so limited. Referring to FIG. 3C and FIG. 4, after removing the silicon nitride material 170 (FIG. 3B), the oxide material 160 may be conformally formed adjacent to (e.g., over, on sides of) the conductive contacts 132 and the etch stop material 172, if present. For example, the oxide material 160 may form a liner over the uppermost insulative material 110, the conductive contacts 132, and the etch stop material 172. The oxide material 160 may be formed by, for example, one or more of CVD, ALD, plasma-enhanced ALD, PVD, PECVD, or LPCVD.

After forming the oxide material 160, the conductive material 162 may be formed adjacent to surfaces of the oxide material 160 and the semiconductor structure 400 may be exposed to a CMP process. The second deck 105 (FIG. 2) may be formed adjacent to the conductive material 162 as described above with reference to FIG. 3D to form the microelectronic device 200 described with reference to FIG. 2.

Although FIG. 3A through FIG. 3D and FIG. 4 have been described as a gate first process, the disclosure is not so limited. In other embodiments, the microelectronic devices 100, 200 may be formed by a so-called "replacement gate" process. In some such embodiments, rather than forming the stack to include alternating levels of the insulative material 110 and the conductive material 112 as described above with reference to FIG. 3A, a stack comprising alternating levels of the insulative material 110 and an other insulative material may be formed adjacent to the conductive material 108 (e.g., the conductive materials 112 of FIG. 3A may be replaced with the other insulative material). The other insulative material may comprise an electrically insulative material exhibiting an etch selectivity relative to the insulative material 110, such as silicon nitride. Openings may be formed through the stack of alternating levels of the insulative material 110 and the other insulative material and through the conductive material 108 and the etch stop material 106. A channel material may be formed in the openings, such as in an entirety of the opening or at least on sidewalls of the opening. In some embodiments, a dielectric material (e.g., silicon dioxide) may fill a remainder of the opening. Additional openings through the alternating levels of the insulative material and the other insulative material may be formed to expose the source 104. The other insulative material may be selectively removed relative to the insulative material 110 to form recesses between adjacent levels of the insulative material 110. After removing the other insulative material, memory cells 130 may be formed in the another openings, such as by forming a dielectric material (e.g., a charge storage material) in the recesses, forming an electrode material adjacent to the charge storage material, and forming an insulative material in the remaining portion of the another openings. In other embodiments, the other dielectric material 128 is formed in the recesses, the electrode material 126 is formed adjacent to the other dielectric material 128, and the dielectric material 124 is formed adjacent to the electrode material 126. The microelectronic device may be completed as described above.

Figure 5:
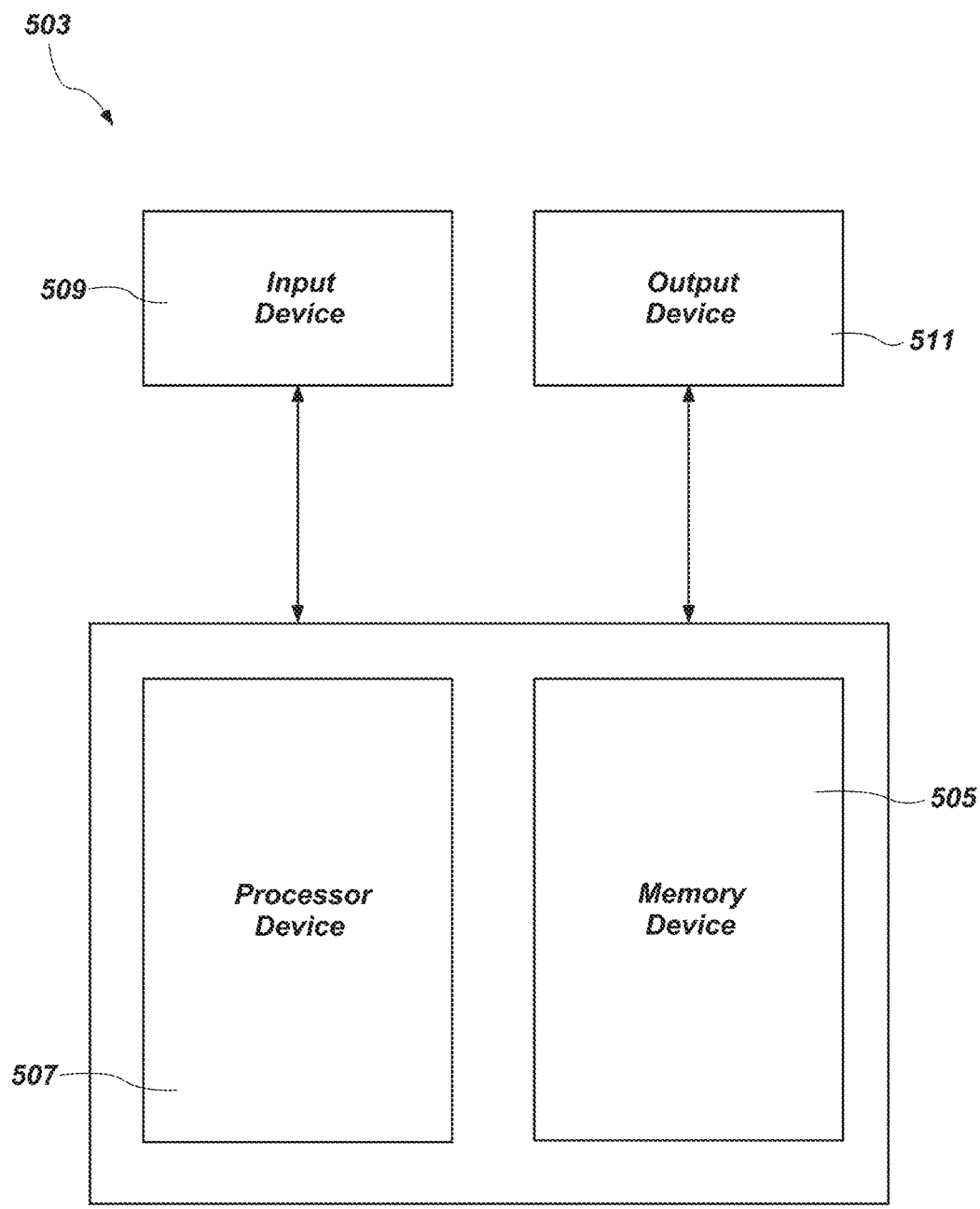
FIG. 5 is a block diagram of an electronic system, in accordance with embodiments of the disclosure.

Accordingly, in at least one embodiment, a method of forming a microelectronic device comprises forming a first deck comprising a channel material extending through a stack of alternating levels of a first material and a second material, forming a nitride material adjacent to the first deck, forming openings in the nitride material and conductive contacts in the openings, removing the nitride material, forming an oxide material adjacent to the conductive contacts, and forming a second deck adjacent to the oxide material, the second deck comprising alternating levels of a first material and a second material.

microelectronic devices (e.g., the microelectronic devices 100, 200) including the oxide material 136 or the oxide material 160 and the conductive material 162 between the first deck 103 and the second deck 105 in accordance with embodiments of the disclosure may be used in embodiments of electronic systems of the disclosure. For example, FIG. 5 is a block diagram of an illustrative electronic system 503 according to embodiments of disclosure. The electronic system 503 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 503 includes at least one memory device 505. The memory device 505 may include, for example, an embodiment of a microelectronic device previously described herein (e.g., microelectronic devices 100, 200) including an oxide material (e.g., the oxide material 136 or the oxide material 160) between adjacent decks (e.g., the first deck 103, the second deck 105) comprising a material that does not trap charges.

The electronic system 503 may further include at least one electronic signal processor device 507 (often referred to as a "microprocessor"). The electronic signal processor device 507 may, optionally, include an embodiment of a microelectronic device previously described herein (e.g., the microelectronic devices 100, 200). The electronic system 503 may further include one or more input devices 509 for inputting information into the electronic system 503 by a user, such as, for example, a mouse or other pointing device, a keyboard, a touchpad, a button, or a control panel. The electronic system 503 may further include one or more output devices 511 for outputting information (e.g., visual or audio output)

to a user such as, for example, a monitor, a display, a printer, an audio output jack, a speaker, etc. In some embodiments, the input device 509 and the output device 511 may comprise a single touchscreen device that can be used both to input information to the electronic system 503 and to output visual information to a user. The input device 509 and the output device 511 may communicate electrically with one or more of the memory device 505 and the electronic signal processor device 507.

Figure 6:
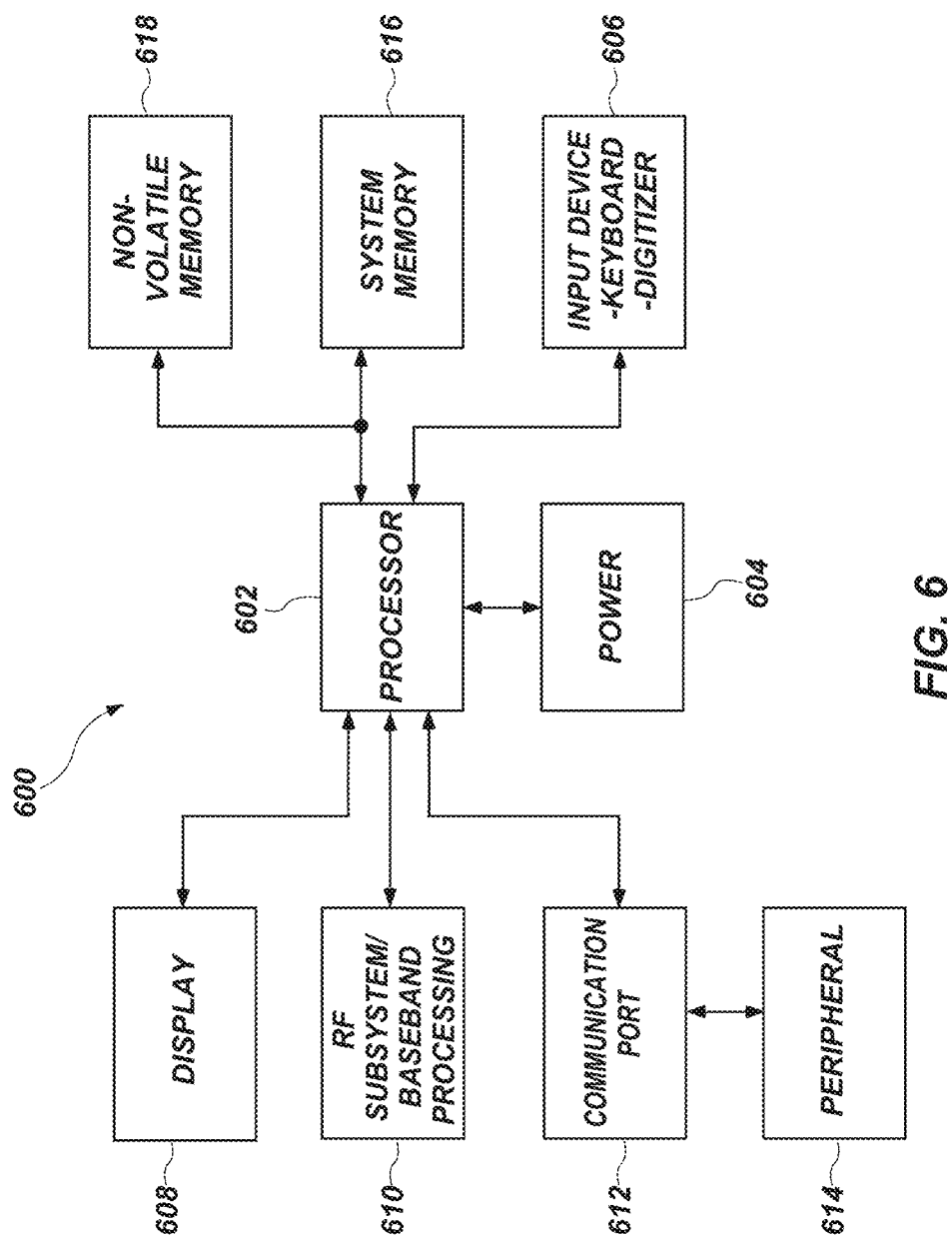
FIG. 6 is a processor-based system, in accordance with embodiments of the disclosure.

With reference to FIG. 6, depicted is a processor-based system 600. The processor-based system 600 may include various electronic devices manufactured in accordance with embodiments of the present disclosure. The processor-based system 600 may be any of a variety of types such as a computer, pager, cellular phone, personal organizer, control circuit, or other electronic device. The processor-based system 600 may include one or more processors 602, such as a microprocessor, to control the processing of system functions and requests in the processor-based system 600. The processor 602 and other subcomponents of the processor-based system 600 may include microelectronic devices (e.g., microelectronic devices 100, 200) manufactured in accordance with embodiments of the present disclosure.

The processor-based system 600 may include a power supply 604 in operable communication with the processor 602. For example, if the processor-based system 600 is a portable system, the power supply 604 may include one or more of a fuel cell, a power scavenging device, permanent batteries, replaceable batteries, and rechargeable batteries. The power supply 604 may also include an AC adapter; therefore, the processor-based system 600 may be plugged into a wall outlet, for example. The power supply 604 may also include a DC adapter such that the processor-based system 600 may be plugged into a vehicle cigarette lighter or a vehicle power port, for example.

Various other devices may be coupled to the processor 602 depending on the functions that the processor-based system 600 performs. For example, a user interface 606 may be coupled to the processor 602. The user interface 606 may include input devices such as buttons, switches, a keyboard, a light pen, a mouse, a digitizer and stylus, a touch screen, a voice recognition system, a microphone, or a combination thereof. A display 608 may also be coupled to the processor 602. The display 608 may include an LCD display, an SED display, a CRT display, a DLP display, a plasma display, an OLED display, an LED display, a three-dimensional projection, an audio display, or a combination thereof. Furthermore, an RF sub-system/baseband processor 610 may also be coupled to the processor 602. The RF sub-system/baseband processor 610 may include an antenna that is coupled to an RF receiver and to an RF transmitter (not shown). A communication port 612, or more than one communication port 612, may also be coupled to the processor 602. The communication port 612 may be adapted to be coupled to one or more peripheral devices 614, such as a modem, a printer, a computer, a scanner, or a camera, or to a network, such as a local area network, remote area network, intranet, or the Internet, for example.

The processor 602 may control the processor-based system 600 by implementing software programs stored in the memory. The software programs may include an operating system, database software, drafting software, word processing software, media editing software, or media playing software, for example. The memory is operably coupled to the processor 602 to store and facilitate execution of various programs. For example, the processor 602 may be coupled to system memory 616, which may include one or more of spin torque transfer magnetic random-access memory (STT-MRAM), magnetic random-access memory (MRAM), dynamic random-access memory (DRAM), static random-access memory (SRAM), racetrack memory, and other known memory types. The system memory 616 may include volatile memory, non-volatile memory, or a combination thereof. The system memory 616 is typically large so that it can store dynamically loaded applications and data. In some embodiments, the system memory 616 may include microelectronic devices, such as the microelectronic devices (e.g., the microelectronic devices 100, 200) described above, or a combination thereof.

The processor 602 may also be coupled to non-volatile memory 618, which is not to suggest that system memory 616 is necessarily volatile. The non-volatile memory 618 may include one or more of STT-MRAM, MRAM, read-only memory (ROM) such as an EPROM, resistive read-only memory (RROM), and flash memory to be used in conjunction with the system memory 616. The size of the non-volatile memory 618 is typically selected to be just large enough to store any necessary operating system, application programs, and fixed data. Additionally, the non-volatile memory 618 may include a high-capacity memory such as disk drive memory, such as a hybrid-drive including resistive memory or other types of non-volatile solid-state memory, for example. The non-volatile memory 618 may include microelectronic devices, such as the microelectronic devices (e.g., the microelectronic devices 100, 200) described above, or a combination thereof.

Accordingly, in at least some embodiments, an electronic system comprises a first deck and a second deck. Each of the first deck and the second deck comprise a stack of alternating levels of conductive material and insulative material, and pillars comprising a channel material extending through the alternating levels of the conductive material and the insulative material. The electronic system further comprises conductive contacts between the channel material of the pillars of the first deck and the channel material of the pillars of the second deck, and an oxide material adjacent to the conductive contacts and between the first deck and the second deck.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:
1. A microelectronic device, comprising:
   a deck comprising tiers respectively including conductive material and insulative material vertically neighboring the conductive material;
   an additional deck overlying the deck and comprising additional tiers respectively including additional conductive material and additional insulative material vertically neighboring the additional conductive material;
   an interdeck structure vertically interposed between the deck and the additional deck, the interdeck structure comprising dielectric oxide material;

pillar structures comprising semiconductor material vertically extending through the deck;
conductive contact structures within the interdeck structure and on upper surfaces of the pillar structures; and
additional pillar structures comprising additional semiconductor material vertically extending through the additional deck and the interdeck structure to the conductive contact structures, for each of the additional pillar structures, a horizontal center thereof substantially aligned with a horizontal center of a respective one of the conductive contact structures and a horizontal center of a respective one of the pillar structures.

2. The microelectronic device of claim 1, wherein the dielectric oxide material of the interdeck structure comprises silicon dioxide.

3. A microelectronic device, comprising:
a deck comprising tiers respectively including conductive material and insulative material vertically neighboring the conductive material;
an additional deck overlying the deck and comprising additional tiers respectively including additional conductive material and additional insulative material vertically neighboring the additional conductive material;
an interdeck structure vertically interposed between the deck and the additional deck, the interdeck structure comprising dielectric oxide material;
pillar structures comprising semiconductor material vertically extending through the deck;
conductive contact structures within the interdeck structure and on upper surfaces of the pillar structures; and
additional pillar structures comprising additional semiconductor material vertically extending through the additional deck and the interdeck structure to the conductive contact structures;
wherein the dielectric oxide material of the interdeck structure physically contacts and substantially continuously extends across side surfaces of the conductive contact structures, side surfaces of the additional pillar structures, and an upper surface of the deck.

4. The microelectronic device of claim 3, wherein the interdeck structure further comprises a conductive fill material on and substantially continuously extending across an upper surface of the dielectric oxide material and a lower surface of the additional deck.

5. The microelectronic device of claim 1, wherein the additional deck further comprises an etch stop material vertically interposed between a lowest one of the additional tiers and the interdeck structure, the etch stop material having a different material composition than each of the additional insulative material and the interdeck structure.

6. A microelectronic device, comprising:
a deck comprising tiers respectively including conductive material and insulative material vertically neighboring the conductive material;
an additional deck overlying the deck and comprising additional tiers respectively including additional conductive material and additional insulative material vertically neighboring the additional conductive material;
an interdeck structure vertically interposed between the deck and the additional deck, the interdeck structure comprising dielectric oxide material;
pillar structures comprising semiconductor material vertically extending through the deck;
conductive contact structures within the interdeck structure and on upper surfaces of the pillar structures; and
additional pillar structures comprising additional semiconductor material vertically extending through the additional deck and the interdeck structure to the conductive contact structures, for each of the additional pillar structures, a lower portion thereof within the interdeck structure horizontally bulging outward relative to an upper portion thereof within the additional deck.

7. A memory device, comprising:
a lower deck comprising conductive material and insulative material vertically alternating with the conductive material;
strings of memory cells vertically extending though the lower deck;
an interdeck structure vertically above the lower deck and the strings of memory cells, the interdeck structure comprising:
dielectric oxide material having a thickness of less than an entire vertical height of the interdeck structure; and
further conductive material on the dielectric oxide material;
conductive contact structures embedded within the interdeck structure and coupled to the strings of memory cells;
an upper deck vertically above the interdeck structure and comprising additional conductive material and additional insulative material vertically alternating with the additional conductive material; and
additional strings of memory cells vertically extending though the upper deck and coupled to the conductive contact structures;
wherein the dielectric oxide material of the interdeck structure electrically isolates the further conductive material of the interdeck structure from the strings of memory cells, the conductive contact structures, and the additional strings of memory cells.

8. The memory device of claim 7, wherein the further conductive material of the interdeck structure comprises polysilicon.

9. The memory device of claim 7, wherein:
the strings of memory cells comprise strings of floating gate memory cells; and
the additional strings of memory cells comprise additional strings of floating gate memory cells.

10. The memory device of claim 7, further comprising:
a source structure vertically below the lower deck and coupled to the strings of memory cells; and
digit line structures vertically above the upper deck and coupled to the additional strings of memory cells.

11. A dual-deck 3D NAND Flash memory device, comprising:
a lower deck comprising:
tiers each including tungsten and silicon oxide vertically neighboring the tungsten; and
an etch stop material below the tiers;
strings of floating gate memory cells vertically extending though the lower deck;
an upper deck above the lower deck and comprising:
additional tiers each including additional tungsten and additional silicon oxide neighboring the additional tungsten;
additional etch stop material below the additional tiers;
additional strings of floating memory cells vertically extending though the upper deck; and
an interdeck region between the lower deck and the upper deck, the interdeck region comprising:

conductive contacts coupled to the strings of floating gate memory cells and the additional strings of floating memory cells;

further silicon oxide on surfaces of the conductive contacts; and void spaces at least partially defined by surfaces of the further silicon oxide.

12. A dual-deck 3D NAND Flash memory device, comprising:

a lower deck comprising:
tiers each including tungsten and silicon oxide vertically neighboring the tungsten; and
an etch stop material below the tiers;

strings of floating gate memory cells vertically extending though the lower deck;

an upper deck above the lower deck and comprising:
additional tiers each including additional tungsten and additional silicon oxide neighboring the additional tungsten;
additional etch stop material below the additional tiers;

additional strings of floating memory cells vertically extending though the upper deck; and an interdeck region between the lower deck and the upper deck, the interdeck region comprising:

conductive contacts coupled to the strings of floating gate memory cells and the additional strings of floating memory cells; and further silicon oxide on surfaces of the conductive contacts and on lower portions of channel structures employed by the additional strings of floating memory cells, the channel structures vertically extending through the upper deck and into the interdeck region.

13. The dual-deck 3D NAND Flash memory device of claim 12, wherein the channel structures respectively comprise one of polysilicon and metal oxide semiconductor material.

14. The dual-deck 3D NAND Flash memory device of claim 11, wherein the interdeck region further comprises conductive material on surfaces of the further silicon oxide, the further silicon oxide electrically isolating the conductive material from the conductive contacts, the strings of floating gate memory cells, and the additional strings of floating memory cells.

15. The dual-deck 3D NAND Flash memory device of claim 14, wherein the conductive material of the interdeck region comprises one of polysilicon and further tungsten.

\* \* \* \* \*

UNITED STATES PATENT AND TRADEMARK OFFICE
CERTIFICATE OF CORRECTION

| | | |
|---|---|---|
| PATENT NO. | : 12,310,024 B2 | Page 1 of 1 |
| APPLICATION NO. | : 18/437609 | |
| DATED | : May 20, 2025 | |
| INVENTOR(S) | : Andrew Bicksler et al. | |

It is certified that error appears in the above-identified patent and that said Letters Patent is hereby corrected as shown below:

In the Specification

| | | |
|---|---|---|
| Column 2, | Line 35, | change "for case of following" to --for ease of following-- |
| Column 3, | Line 46, | change "for case of description" to --for ease of description-- |

Signed and Sealed this
Second Day of September, 2025

Coke Morgan Stewart
*Acting Director of the United States Patent and Trademark Office*